United States Patent [19]
Wu

[11] Patent Number: 6,104,629
[45] Date of Patent: Aug. 15, 2000

[54] HIGH FREQUENCY MEMORY MODULE

[75] Inventor: Leon L. Wu, Austin, Tex.

[73] Assignee: International Business Machines Corporation, Armonk, N.Y.

[21] Appl. No.: 09/156,134

[22] Filed: Sep. 17, 1998

[51] Int. Cl.[7] ................................................. G11C 5/06
[52] U.S. Cl. ............................................. 365/63; 365/52
[58] Field of Search ........................................ 365/52, 63

[56] References Cited

U.S. PATENT DOCUMENTS

| | | | |
|---|---|---|---|
| 5,260,892 | 11/1993 | Testa ........................................ | 365/63 |
| 5,319,591 | 6/1994 | Takeda et al. ............................ | 365/63 |
| 5,397,747 | 3/1995 | Angiulli et al. . | |
| 5,831,890 | 11/1998 | Selna et al. ............................... | 365/63 |

OTHER PUBLICATIONS

Henle, "Verticle Chip Packagin", IBM Technical Disclosure Bulletin, vol. 20, No. 11A, Apr. 1978.

*Primary Examiner*—Son T. Dinh
*Attorney, Agent, or Firm*—Russell D. Culbertson; Anthony V. S. England

[57] ABSTRACT

Memory chips (15) are mounted perpendicularly on a memory module substrate (14) to achieve a close spacing between the chips. A plurality of memory chip signal lines (20) are located on the memory module substrate (14) and the memory chips (15) are electrically coupled to the memory chip signal lines at spaced apart chip coupling points (23). Digital signals are driven to the memory chip signal lines (20) through signal lines (21) having a first level impedance. The memory chip signal lines (20) have a second level impedance greater that the first level impedance. The spacing between the chip coupling points (23) is chosen such that the effective impedance level of the memory chip signal lines (20) substantially matches the lower, first level impedance.

21 Claims, 3 Drawing Sheets

HIGH FREQUENCY MEMORY MODULE

TECHNICAL FIELD OF THE INVENTION

This invention relates to computer memory devices and, more particularly, to a memory module for use in high frequency digital systems.

BACKGROUND OF THE INVENTION

Individual memory chips used for random access memory (RAM) in digital systems are commonly mounted on modules such as a single in-line memory module (SIMM) or a dual in-line memory module (DIMM). Each memory module includes several individual memory chips mounted on a single module substrate such as a printed circuit board, for example. The memory modules are mounted on a system substrate or motherboard. Digital signals are driven to the memory chips from a driver which is commonly located on a separate chip mounted on the system motherboard. A network or net of conductors, commonly referred to as transmission lines or signal lines, carry each signal from the driver to the memory module and ultimately to the memory chips. Since many different signals are commonly transferred to the memory module, there are usually many parallel sets of signal lines, each extending from a driver to the memory chips. Traditionally, the impedance of all signal lines in a system board has a single value, 50 or 60 ohns for example.

A memory chip on a memory module represents a capacitive load on the signal line to which the memory chip is coupled. Each of these capacitive loads will cause a reflection of the signal applied to the signal line. In the case of a memory module with multiple memory chips coupled to a module signal line, the effect of the multiple capacitive loads is related to the spacing between the loads. If the magnitude of the signal time of flight between two loads is comparable to the rise time of the signal, the reflection will cause significant rise time degradation. The time of flight refers to the time it takes a signal to travel between two points, while the rise time refers to the time it takes for a digital signal to go from a low level voltage to a high level voltage. For example, in a single in-line memory module the time of flight between memory chips may be about 200 to 300, picoseconds. This time of flight is comparable to the driver rise time of about 500 to 1000 picoseconds. In this example, a signal propagating on the signal line to which the memory chips are coupled will experience a significant rise time degradation from all memory chips. This signal rise time degradation may interfere with the desired signals driven on the signal line and thus the operation of the system.

The time of flight of signals between the memory chips of a module may be reduced by reducing the spacing between the chips. One way to reduce the spacing is to mount the chips perpendicularly to the module substrate. U.S. Pat. No. 5,397,747 shows a chip packaging arrangement which includes perpendicularly mounted memory chips. However, even if the memory chip spacing is reduced to reduce the rise time degradation caused by the reflection produced at the memory chips themselves, the multiple capacitive loads on the chip signal line also reduce the effective impedance exhibited by the signal line. This reduced effective impedance in the chip signal line creates an impedance mismatch at the boundaries in the net between regions with and without memory chip couplings, and this mismatch produces a signal reflection.

SUMMARY OF THE INVENTION

It is an object of the invention to provide a high frequency memory module which overcomes the above-described problems in the prior art. More particularly, it is an object of the invention to provide a high frequency memory module and a system memory arrangement which reduces or eliminates reflections in the net of signal lines between the signal driver or receiver and the memory chips.

These objects are accomplished by providing two signal line impedance levels in the wiring layers of the system board and high frequency module, and by providing a particular spacing between the memory chips on the high frequency memory module. One impedance level comprises a low level or first level impedance which may be 20 to 30 ohms for example, while the other impedance level comprises a regular level or second level impedance which may be 50 ohms for example.

The invention may be described by focusing on the communication between a logic chip and a group of the memory chips housed on a high frequency memory module. To further simplify the discussion, the logic chip described herein is assumed to be directly soldered to one particular location of the system board, although the logic chip can be housed on a chip carrier within the scope of the invention. A series of signal lines are used to connect the logic chip and the several memory chips. This series of signal lines originates from a driver circuit implemented on the logic chip, extends to the receivers of the each of the memory chips in a daisy chain fashion, and terminates at a terminator chip mounted on the high frequency memory module. The series of signal lines includes a system signal line which comprises a wiring layer on the system board on which the logic chip and memory module are mounted. A driver-side signal line and memory chip signal line each comprise a different wiring layer on the memory module. A terminator-side signal line also comprises a wiring layer on the memory module. According to the invention, the memory chip signal line is at the regular level impedance while the system. driver-side, and terminator-side signal lines are each at the low level impedance.

The system signal line is connected at one end to the driver circuit and is connected at its opposite end to the driver-side signal line. The driver-side signal line extends to and is connected to one end of the memory chip signal line while the other end of the memory chip signal line is connected to the terminator-side signal line. The terminator chip is connected at the end of the terminator-side signal line opposite to the end connected to the memory chip signal line. The memory chip spacing along the memory chip signal line is chosen to minimize the reflection effects on the rise time due to each individual memory chip. The spacing is also chosen so that the effective impedance of the memory chip signal line, considering the capacitive loading effect of the memory chips, is equal to the low level impedance and thus matches the impedance level of the other signal lines in the series of lines. Thus, the arrangement reduces the degradation of signal quality caused by global mismatch in effective impedance and local loading of the net due to the memory chips.

In the preferred form of the invention, each low level impedance signal line is placed on the first wiring layer of the system board, and the lines at the regular impedance level are distributed in the rest of the system board wiring layers. For the high frequency module, each regular impedance level signal line is placed on the top wiring layer of the module substrate. The low level impedance signal lines comprising the driver-side and terminator-side signal lines are distributed in the rest of the module substrate. This distribution of wiring layers in relation to the package cross-section is one example; however, other arrangements may be used within the scope of invention.

In the preferred form of the invention, the memory chips are mounted perpendicularly to the memory module substrate to achieve the desired closer spacing. The individual memory chips may be mounted directly on a chip carrier and each chip carrier is in turn connected to the memory module substrate.

The same series of signal lines can be used to send signals from any of the memory chips back to the logic chip. In this case, a memory chip driver is connected to the memory chip signal line and a receiver at the logic chip is connected to the system signal line. When a signal is being sent from a memory chip to the logic chip, the driver at the logic chip and is disabled. Similarly, the memory chip driver is disabled when a signal is being sent from the logic chip to the memory chip.

These and other objects, advantages, and features of the invention will be apparent from the following description of the preferred embodiments, considered along with the accompanying drawings.

DESCRIPTION OF THE PREFERRED EMBODIMENTS

Figure 1:
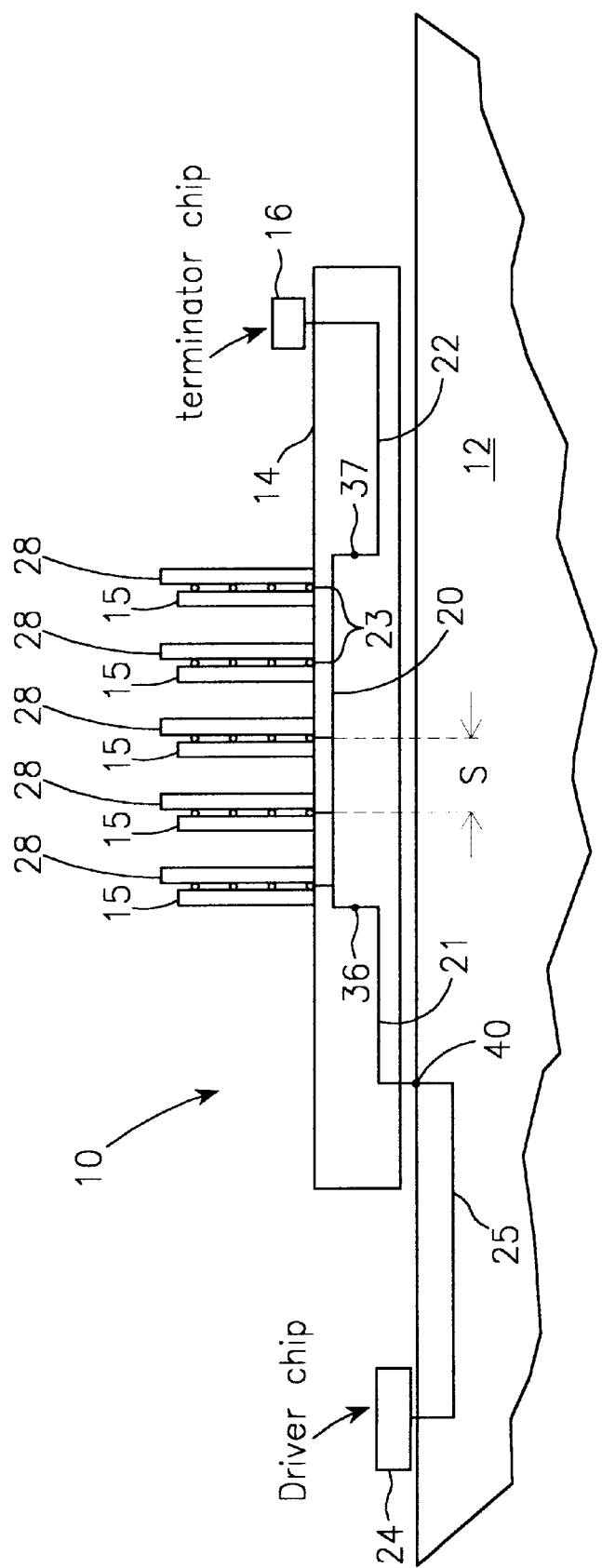
FIG. 1 is a diagrammatic side view of a high frequency memory module embodying the principles of invention mounted on a system substrate.
Figure 2:
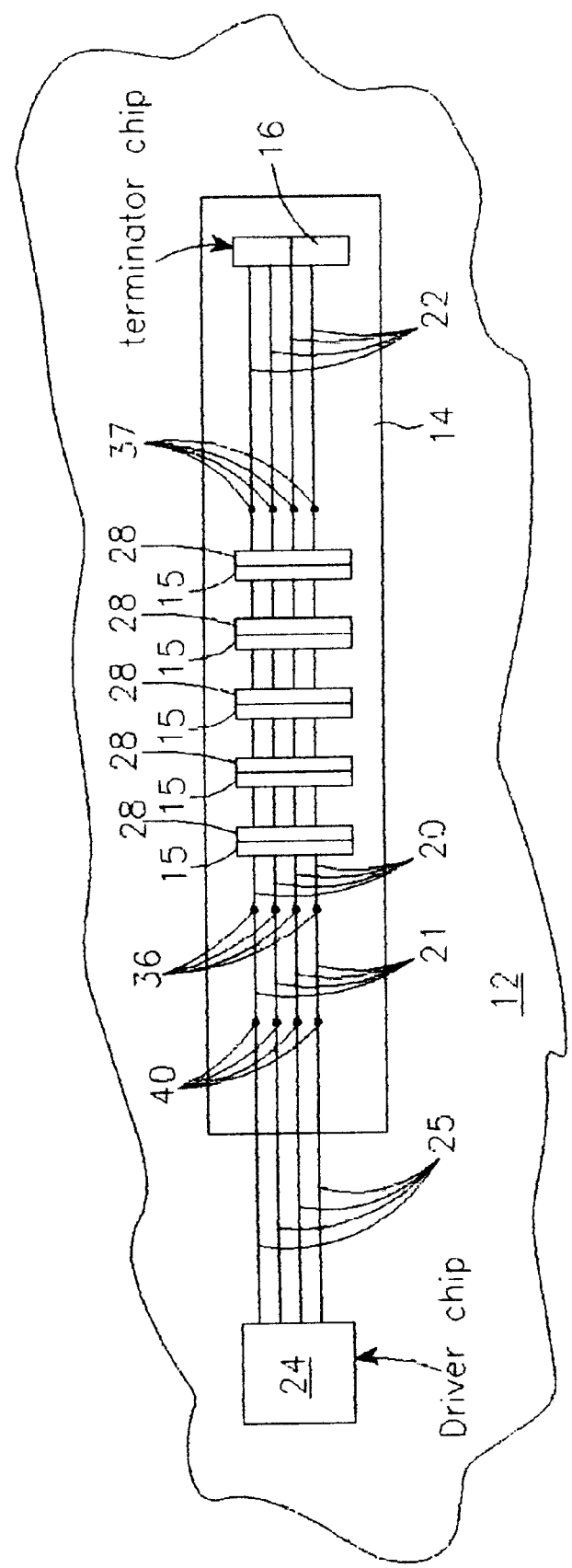
FIG. 2 is a diagrammatic top view of the high frequency memory module and system board shown in FIG. 1.

FIGS. 1 and 2 provide diagrammatic representations of a memory module 10 embodying the principles of the invention and a portion of a system board or motherboard having a system substrate 12 on which the memory module is mounted. Certain details, including the physical connections between the memory module 10 and system substrate 12, are omitted from FIGS. 1 and 2 so as not to obscure the invention in unnecessary details. Details such as the particular connections between the memory module 10 and system substrate 12 are unnecessary for an understanding of the invention and are in any event within the knowledge of those skilled in the art.

Memory module 10 includes a module substrate 14 and a plurality of memory chips 15 mounted on the module substrate. A terminator chip 16 is also mounted on module substrate 14. The illustrated form of the invention includes three separate types of signal lines or transmission lines including regular impedance signal lines 20 on the memory module substrate 14, low level impedance signal lines 21 and 22 on the memory module substrate, and low level irnpedance signal lines 25 on the system substrate 12. The low level impedance in the illustrated form of the invention may be 20 to 30 ohms, while the regular impedance may be 50 ohms, for example. For convenience in referring to the various signal lines in this disclosure and the appended claims, signal line 20 is referred to as the "memory chip" signal line, signal line 21 is referred to as the "driver-side" signal line, signal line 22 is referred to as the "terminator-side" signal line, and signal line 25 is referred to as the "system" signal line.

FIG. 1 shows the various signal lines 20, 21, and 22 of the preferred memory module 10 at different levels in the module substrate 14. These different levels are representational only and used to help distinguish the three different signal lines 20, 21, and 22. In the actual construction of a memory module according to the invention, the signal lines 20, 21, and 22 may be at any physical level in or on the particular module substrate 14. Also, for purposes of illustrating the invention, FIG. 2 shows only four separate sets of these signal lines, each set for carrying a different series of signals to the various memory chips 15. Those skilled in the art will readily appreciate that a memory module according to the invention may include any number of separate signal line sets and that the invention is not limited to any particular number of such sets. Four signal line sets are chosen in the drawings for simplicity in illustrating and describing the invention.

Memory module 10 is adapted to be mounted on the system substrate 12. A driver chip 24 is also mounted by suitable means on system substrate 12. Chip 24 is referred to herein as the "driver chip" because it includes a driver circuit for driving digital signals through the various sets of signal lines in the memory module 10. It will be appreciated that logic functions may also be implemented on chip 24 as well as a receiver for receiving signals from the memory chips. The system signal lines 25 are provided on system substrate 12 for carrying signals from the driver chip 24 to the memory module 10. According to the invention, driver chip 24 operates at the low level impedance and the system signal lines 25 substantially match this low level impedance. However, the remainder of the system (not shown) mounted on the system substrate 12 may operate at another impedance level, such as the regular impedance level (50 ohms), or at some other impedance level Memory module 10 may be mounted on system substrate 12 in any suitable fashion. The required electrical connections between the system signal lines 25 on the system substrate 12 and the driver-side signal lines 21 on the memory module 10 may also be made by any suitable means. For example, the connection may be either a suitable socket or a solder connection.

Figure 4:
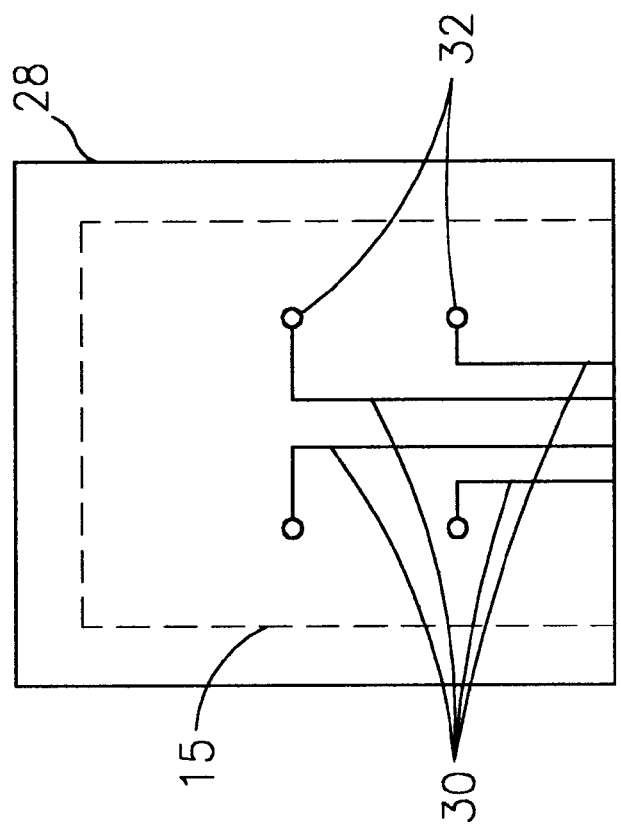
FIG. 4 is a diagrammatic plan view of the memory chip and chip carrier shown in FIG. 3.
Figure 3:
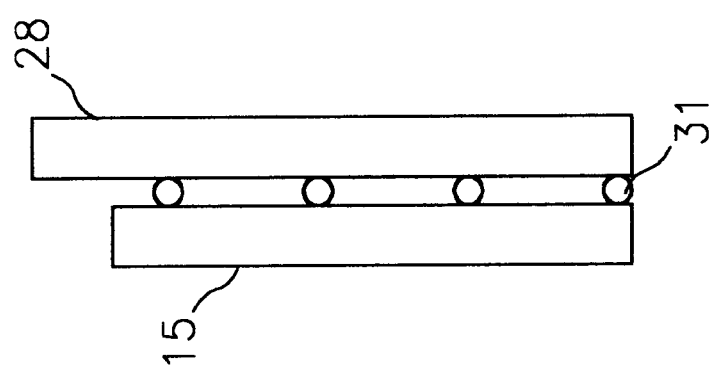
FIG. 3 is a diagrammatic side view of a memory chip and chip carrier for use in the memory module shown in FIG. 1.

The function of the memory module substrate 14 is to support the memory chip signal lines 20, driver-side signal lines 21, and terminator-side signal lines 22 located on the substrate, and to support memory chips 15. The memory module substrate 14 may be made of any material capable of performing these functions such as printed circuit board or a suitable ceramic material. In the illustrated form of the invention, each memory chip 15 is directly mounted on a substantially planar chip carrier 28. The chip carriers 28 and memory chips 15 are mounted generally perpendicular to a mounting surface 30 of the module substrate. Referring particularly to FIGS. 3 and 4, each chip carrier 28 may comprise a printed circuit board, a ceramic material, or any other material suitable for providing structural support for the memory chip 15. Each chip to carrier 28 preferably includes a number of signal lines 30 for carrying signals to and/or from the various pins 32 of the memory chip 15 mounted on the particular chip carrier. Each of these chip carrier signal lines 30 preferably terminates at a suitable pad 31 at one edge of the chip carrier. The chip carriers 28 may be mounted on the module substrate 14 through solder ball or C4 connections. The solder ball connections support the chip carriers 28 and memory chips 15 perpendicular to the module substrate 14 and also provide the electrical connections required between the chip carrier pads 31 and the chip-level signal lines 20 of the memory module 10.

The perpendicular memory chip mounting arrangement is used in the preferred form of the invention to reduce the spacing S (shown in FIG. 1) between chip coupling points 23 along the memory chip signal lines 20. Spacing S may be on the order of 0.15 to 0.3 centimeters, however, even smaller spacing is preferable. In any event, the spacing S between chip coupling points 23 should be sufficiently small such that the time of flight for signals between the chip coupling points is significantly less than the driver rise time associated with driver chip 24. This arrangement reduces the reflections caused by the capacitive loads of the memory chips 15. Although the perpendicular chip arrangement is preferred for achieving the desired reduced spacing S, any arrangement which provides this close spacing may be employed within the scope of the invention.

According to the invention, the spacing S between chip coupling points is also chosen such that each memory chip signal line 20 exhibits an effective impedance $Z_e$ substantially matching the low level impedance. The effective impedance $Z_e$ of each memory chip signal line 20 is given by the expression $Z_o[S/(S+(Z_o VC))]^{0.5}$, where S represents the spacing between any two chip coupling points 23, $Z_o$ represents the regular impedance, that is, the impedance of the memory chip signal line 20, V represents the propagation velocity of a signal on the memory chip signal line 20, and C represents the capacitive load presented by each memory chip 15. By causing each memory chip signal line 20 to exhibit an effective impedance $Z_e$ matching the low level impedance, signal reflection is mostly eliminated at the junction 36 between the memory chip signal line 20 and respective driver-side signal line 21, and at the junction 37 between the memory chip signal line 20 and respective terminator-side signal line 22. This combination of attributes enables the memory module 10 to exhibit nearly a first incident switching response. Such switching response is particularly important in high frequency systems such as systems having a clock speed of 500 MHZ or more.

The operation of memory module 10 according to invention may be described with particular reference to FIG. 1. The operation of the invention will be described here referring only to a single net of signal lines between the driver chip 24 and memory module 10. However, it will be appreciated that the identical process occurs in each other net of signal lines.

Driver chip 24 drives a digital signal at the low level impedance through the system signal line 25 and the signal is first transferred to the low level impedance driver-side signal line 21 on the memory module substrate 14. Since the driver chip 24, system signal line 25, and driver-side signal line 21 all operate at the low level impedance, no reflections are produced at the junction between the driver chip 24 and system signal line 25 and the junction 40 between the system signal line 25 and driver-side signal line 21. The signal driven from driver chip 24 continues to propagate along the driver-side signal line 21 through junction 36 to the memory chip signal line 20. Although the actual impedance of the memory chip signal line 20 is at the regular level impedance which matches the impedance of the signal lines leading to the memory chips 15, the effective impedance $Z_e$ of memory chip signal line 20 substantially matches the low level impedance due to the spacing S between chip coupling points 23 according to the invention. Thus substantially no signal reflection is produced at the junction 36 between the driver-side signal line 21 and memory chip signal line 20. Similarly, no signal reflection occurs at junction 37 or at the terminator chip 16 since both the terminator-side signal line 22 and terminator chip operate at the low level impedance.

The above described preferred embodiments are intended to illustrate the principles of the invention, but not to limit the scope of the invention. Various other embodiments and modifications to these preferred embodiments may be made by those skilled in the art without departing from the scope of the following claims.

I claim:

1. A high frequency memory module adapted to be coupled to a system substrate having a driver for driving signals to the high frequency memory module through a first level impedance, the memory module comprising:

(a) a module substrate;

(b) a plurality of memory chip signal lines formed on the module substrate, each memory chip signal line having one end coupled to receive signals driven from the driver at the first level impedance and an opposite end coupled to a terminating impedance substantially matching the first level impedance, each memory chip signal line exhibiting a second level impedance which is greater than the first level impedance; and (c) a plurality of memory chips mounted on the module substrate, each memory chip being coupled to each memory chip signal line at a unique chip coupling point, the chip coupling points being spaced apart along the respective memory chip signal line and the memory chips having a characteristic capacitance such that each memory chip signal line exhibits an effective impedance substantially matching the first level impedance.

2. The apparatus of claim 1 wherein the signals from the driver are driven through a plurality of the system signal lines on the system substrate, each system signal line having the first level impedance, and wherein the memory module further comprises:

(a) a plurality of driver-side signal lines formed on the module substrate, each driver-side signal line adapted to be coupled to one of the system signal lines at one end of the respective driver-side signal line and coupled to one of the memory chip signal lines at an opposite end thereof, each driver-side signal line having an impedance substantially matching the first level impedance.

3. The apparatus of claim 2 further comprising:

(a) a plurality of terminator-side signal lines formed on the module substrate, each terminator-side signal line being coupled to an end of a different one of the memory chip signal lines opposite the end of the respective memory chip signal line which is coupled to one of the driver-side signal lines, each terminator-side signal line having an impedance substantially matching the first level impedance; and (b) a terminator associated with the module substrate, the terminator terminating each terminator-side signal line at an end of the respective terminator-side signal line opposite to the end coupled to one of the memory chip signal lines, the terminator having an impedance substantially matching the first level impedance.

4. The apparatus of claim 1 wherein the module substrate has a substantially planar chip mounting surface and the memory chips are mounted on the chip mounting surface of the module substrate substantially perpendicular to the chip mounting surface.

5. The apparatus of claim 4 wherein each memory chip is mounted on a substantially planar chip carrier which is mounted on the module substrate substantially perpendicular to the chip mounting surface.

6. The apparatus of claim 5 wherein the chip carrier associated with each memory chip includes connector lines for coupling the respective memory chip mounted thereon to the memory chip signal lines.

7. The apparatus of claim 4 wherein the chip coupling points are spaced apart a distance S such that an effective impedance $Z_e$ of each memory chip signal line is given by the expression $Z_o[S/(S+(Z_o VC))]^{0.5}$ where $Z_o$ represents the second level impedance, V represents the propagation velocity of a signal along the memory chip signal lines, and C represents a capacitive load presented by each memory chip.

8. The apparatus of claim 1 wherein the chip coupling points are spaced apart a distance S such that an effective impedance $Z_e$ of each memory chip signal line is given by the expression $Z_o[S/(S+(Z_o VC))]^{0.5}$ where $Z_o$ represents the second level impedance, V represents the propagation velocity of a signal along the memory chip signal lines, and C represents a capacitive load presented by each memory chip.

9. A high frequency memory arrangement comprising:

(a) a system substrate;

(b) a driver mounted on the system substrate;

(c) a plurality of system signal lines mounted on the system substrate and coupled at one end to the driver, each system signal line having a first level impedance;

(d) a module substrate mounted on the system substrate;

(e) a plurality of driver-side signal lines formed on the module substrate, each driverside signal line being coupled at one end to one of the system signal lines and having an impedance substantially matching the first level impedance;

(f) a plurality of terminator-side signal lines formed on the module substrate, each terminator-side signal line having an impedance substantially matching the first level impedance;

(g) a plurality of memory chip signal lines formed on the module substrate, each memory chip signal line having one end coupled to a different one of the driver-side signal lines and an opposite end coupled to a different one of the terminator-side signal lines, each memory chip signal line having a second level impedance which is greater than the first level impedance;

(h) a terminator associated with the module substrate, the terminator terminating each terminator-side signal line at an end of the respective terminator-side signal line opposite to the end coupled to one of the memory chip signal lines, the terminator having an impedance substantially matching the first level impedance; and (i) a plurality of memory chips mounted on the module substrate, each memory chip being coupled to each memory chip signal line at a unique chip coupling point, the chip coupling points being spaced apart along the respective memory chip signal line and the memory chips having a characteristic capacitance such that each memory chip signal line has an effective impedance substantially matching the first level impedance.

10. The apparatus of claim 9 wherein the chip coupling points are spaced apart a distance S such that an effective impedance $Z_e$ of each memory chip signal line is given by the expression $Z_o[S/(S+(Z_oVC))]^{0.5}$ where $Z_o$ represents the second level impedance, V represents the propagation velocity of a signal along the memory chip signal lines, and C represents a capacitive load presented by each memory chip.

11. The apparatus of claim 9 wherein the module substrate has a substantially planar chip mounting surface and the memory chips are mounted on the chip mounting surface of the module substrate substantially perpendicular to the chip mounting surface.

12. The apparatus of claim 11 wherein each memory chip is mounted on a substantially planar chip carrier which is mounted on the module substrate substantially perpendicular to the chip mounting surface.

13. The apparatus of claim 12 wherein the chip carrier associated with each memory chip includes connector lines for coupling the respective memory chip mounted thereon to the memory chip signal lines.

14. The apparatus of claim 11 wherein the chip coupling points are spaced apart a distance S such that an effective impedance $Z_e$ of each memory chip signal line is given by the expression $Z_0[S/(S+(Z_0VC))]^{0.5}$ where $Z_0$ represents the second level impedance, V represents the propagation velocity of a signal along the memory chip signal lines, and C represents a capacitive load presented by each memory chip.

15. A high frequency memory module adapted to be coupled to a system substrate having a driver for driving signals to the high frequency memory module through a first level impedance, the memory module comprising:

(a) a module substrate;

(b) a memory chip signal line formed on the module substrate, the memory chip signal line having one end coupled to receive signals driven from the driver at the first level impedance and an opposite end coupled to a terminating impedance substantially matching the first level impedance, the memory chip signal line exhibiting a second level impedance which is greater than the first level impedance; and (c) a plurality of memory chips mounted on the module substrate, each memory chip being coupled to the memory chip signal line at a unique chip coupling point, the chip coupling points being spaced apart along the memory chip signal line and the memory chips having a characteristic capacitance such that the memory chip signal line exhibits an effective impedance substantially matching the first level impedance.

16. The apparatus of claim 15 wherein the signals from the driver are driven through a system signal line on the system substrate, the system signal line having the first level impedance, and wherein the memory module further comprises:

(a) a driver-side signal line formed on the module substrate, the driver-side signal line adapted to be coupled to the system signal line at one end of the driver-side signal line and coupled to the memory chip signal line at an opposite end thereof, the driver-side signal line having an impedance substantially matching the first level impedance.

17. The apparatus of claim 16 further comprising:

(a) a terminator-side signal line formed on the module substrate, the terminator-side signal line being coupled to an end of the memory chip signal line opposite the end of the memory chip signal line which is coupled to the driver-side signal line, the terminator-side signal line having an impedance substantially matching the first level impedance; and (b) a terminator associated with the module substrate, the terminator terminating the terminator-side signal line at an end of the terminator-side signal line opposite to the end coupled to the memory chip signal line, the terminator having an impedance substantially matching the first level impedance.

18. The apparatus of claim 15 wherein the module substrate has a substantially planar chip mounting surface and the memory chips are mounted on the chip mounting surface of the module substrate substantially perpendicular to the chip mounting surface.

19. The apparatus of claim 15 wherein each memory chip is mounted on a substantially planar chip carrier which is mounted on the module substrate substantially perpendicular to the chip mounting surface.

20. The apparatus of claim 19 wherein the chip carrier associated with each memory chip includes a connector line for coupling the respective memory chip mounted thereon to the memory chip signal line.

21. The apparatus of claim 15 wherein the chip coupling points are spaced apart a distance S such that an effective impedance $Z_e$ of each memory chip signal line is given by the expression $Z_o[S/(S+(Z_oVC))]^{0.5}$ where $Z_o$ represents the second level impedance, V represents the propagation velocity of a signal along the memory chip signal lines, and C represents a capacitive load presented by each memory chip.

* * * * *

UNITED STATES PATENT AND TRADEMARK OFFICE
CERTIFICATE OF CORRECTION

PATENT NO. : 6,104,629
DATED : August 15, 2000
INVENTOR(S) : Leon L. Wu

It is certified that error appears in the above-indentified patent and that said Letters Patent is hereby corrected as shown below:

Line 42 at column 4 of the Patent, a new paragraph should begin at the sentence beginning with "In the illustrated".

Claim 9, column 7, line 11 of the Patent, change "driverside" to --driver-side--.

Claim 14, column 7, line 61 of the Patent, change "$Z_c$" to --$Z_e$--.

Signed and Sealed this

Twenty-fourth Day of April, 2001

Attest:

NICHOLAS P. GODICI

Attesting Officer   Acting Director of the United States Patent and Trademark Office